United States Patent
Paulson et al.

[11] Patent Number: 6,039,849
[45] Date of Patent: Mar. 21, 2000

[54] METHOD FOR THE MANUFACTURE OF ELECTRONIC COMPONENTS

[75] Inventors: Jeffrey R. Paulson, Mesa; Arturo Fonda, Scottsdale, both of Ariz.

[73] Assignee: Motorola, Inc., Schaumburg, Ill.

[21] Appl. No.: 08/959,310

[22] Filed: Oct. 28, 1997

[51] Int. Cl.$^7$ ................................................. C23C 14/34
[52] U.S. Cl. ........................... 204/192.12; 204/192.15; 204/298.06; 204/192.35; 118/723 E
[58] Field of Search .................. 118/723 E; 204/298.06, 204/192.12, 192.25, 192.35

[56] References Cited

U.S. PATENT DOCUMENTS

| | | | |
|---|---|---|---|
| 2,373,639 | 4/1945 | Turner | 204/192 |
| 3,507,774 | 4/1970 | Muly, Jr. | 204/298 |
| 3,583,361 | 6/1971 | Laudel, Jr. | 118/49.5 |
| 3,953,619 | 4/1976 | Matsubara | 427/39 |
| 4,227,114 | 10/1980 | De Jule . | |
| 4,389,299 | 6/1983 | Adachi et al. | 204/298 |
| 4,565,618 | 1/1986 | Banks . | |
| 4,727,297 | 2/1988 | Wolze . | |
| 4,833,577 | 5/1989 | Földi et al. . | |
| 5,041,302 | 8/1991 | Koide | 427/38 |
| 5,058,527 | 10/1991 | Ohta et al. | 118/723 |
| 5,133,849 | 7/1992 | Kinoshita et al. | 204/298.05 |
| 5,346,600 | 9/1994 | Nieh et al. | 204/192.3 |
| 5,468,296 | 11/1995 | Patrick et al. | 118/723 MP |
| 5,525,158 | 6/1996 | Tsukazaki et al. | 118/723 |
| 5,556,506 | 9/1996 | Contreras et al. . | |
| 5,565,036 | 10/1996 | Westendorp et al. | 118/723 MP |
| 5,660,700 | 8/1997 | Shimizu et al. | 204/298.08 |
| 5,789,867 | 8/1998 | Westendorp et al. | 315/111.21 |

*Primary Examiner*—Nam Nguyen
*Assistant Examiner*—Julian A. Mercado
*Attorney, Agent, or Firm*—Robert F. Hightower

[57] ABSTRACT

An apparatus (10) such as a plasma sputtering tool has a reaction chamber (11) containing a sputtering target (12) and a semiconductor substrate (13). The apparatus (10) also has a plasma ignitor (70) that is used to excite the gas molecules in the reaction chamber (11) and help generate a plasma in the reaction chamber (11). The plasma ignitor (70) has a relay (59) that is used to activate or deactivate filaments (51,52) at the appropriate times to initiate the formation of a plasma in the reaction chamber (11).

6 Claims, 2 Drawing Sheets

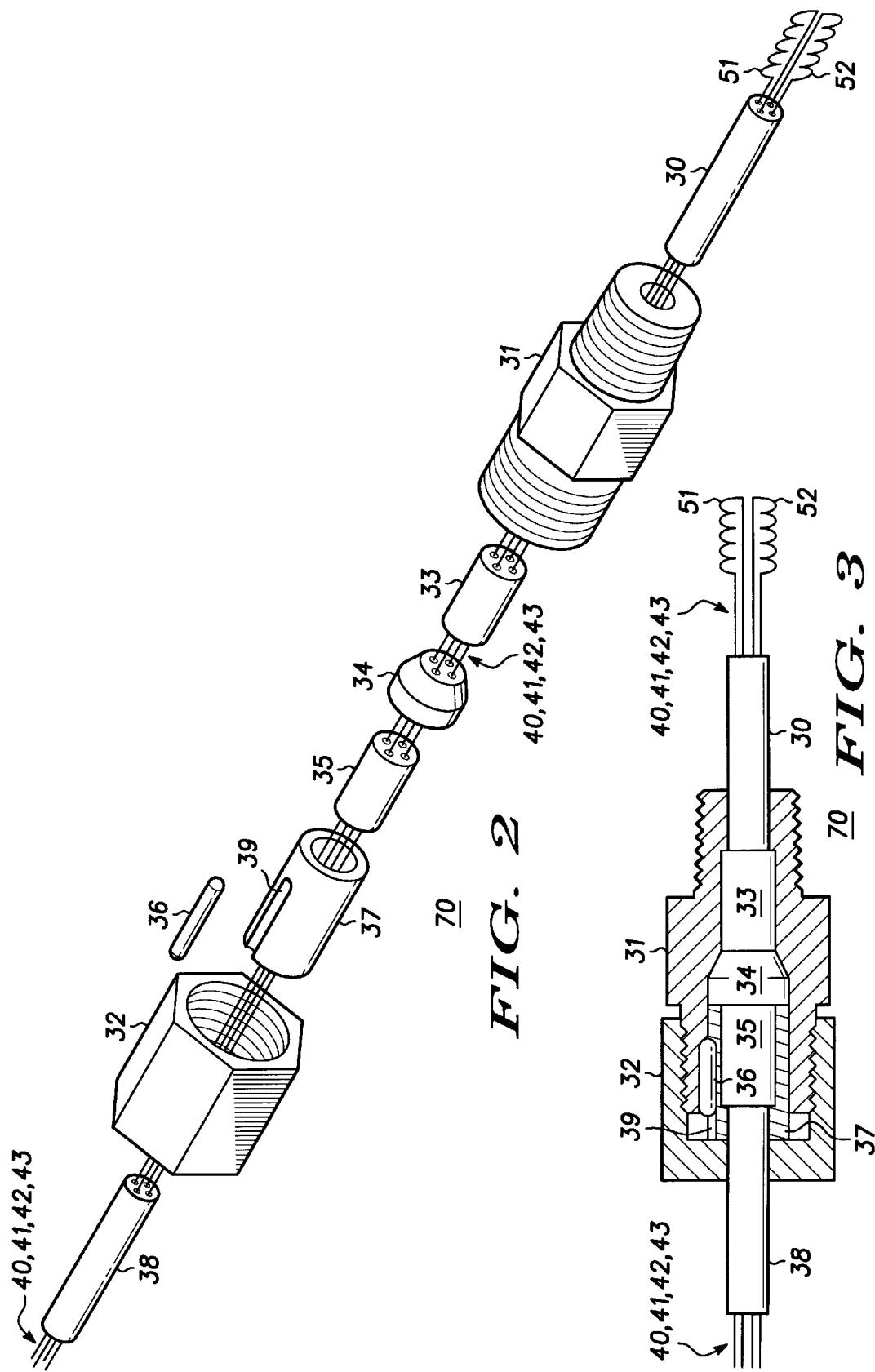

6,039,849

METHOD FOR THE MANUFACTURE OF ELECTRONIC COMPONENTS

BACKGROUND OF THE INVENTION

This invention relates, in general, to electronic components, and more particularly, to apparatuses used to manufacture integrated circuits.

Sputtering deposition tools have been used since at least the early 1970's to deposit films of material onto semiconductor substrates in the fabrication of electronic components. Conventional sputtering equipment has a reaction chamber containing a sputtering target over a semiconductor substrate, both of which are between a pair of electrodes. The reaction chamber is pumped to a vacuum and a plasma ignitor is used to excite gas molecules near the plasma ignitor, which helps ignite the plasma in the reaction chamber. The plasma is then used to direct ions towards the semiconductor substrate in an etch application or towards the sputtering target in a deposition application.

Conventional ignitors have a single filament that helps ignite the plasma by emitting thermal excitation when active. However, in order to effectively ignite the plasma, the filament is placed in relatively close proximity to the sputtering target, the etch platform, or the semiconductor substrate. Therefore, the filament can be partially exposed to the harsh plasma environment. Consequently, the filament becomes brittle while active and is frequently damaged during the operation of a sputtering tool. The average operational lifetime of a filament depends in part on the type of material used to make the target, the number of wafers processed with the equipment, and the location of the filament in the reaction chamber.

When the filament breaks, the sputtering tool is inoperable and must be disabled to replace the filament. This operation can take on average from 12 to 24 hours, during which time no processing of semiconductor substrates can occur. The solution proposed by the manufacturers of sputtering equipment calls for preventative maintenance that replaces the filament at fixed intervals which are theoretically shorter than the expected lifetime of the filament. However, this solution is not a complete solution because it only removes the "unpredictability" of replacing the filaments. The throughput of the sputtering tool is still limited by the time it takes to replace the filament.

Accordingly, there is a long felt need to provide a plasma ignitor that did not have to be replaced as frequently as conventional ignitors, and consequently, increased the up-time and throughput of semiconductor manufacturing tools. In addition, it would also be advantageous if the ignitor could provide semiconductor equipment that has a more predictable preventative maintenance schedule and that could be used for other applications in the semiconductor industry.

BRIEF DESCRIPTION OF THE DRAWINGS

FIG. 2 is an exploded view of a plasma ignitor in accordance with the present invention;

FIG. 3 is a cross-sectional view of the plasma ignitor; and

Figure 1:
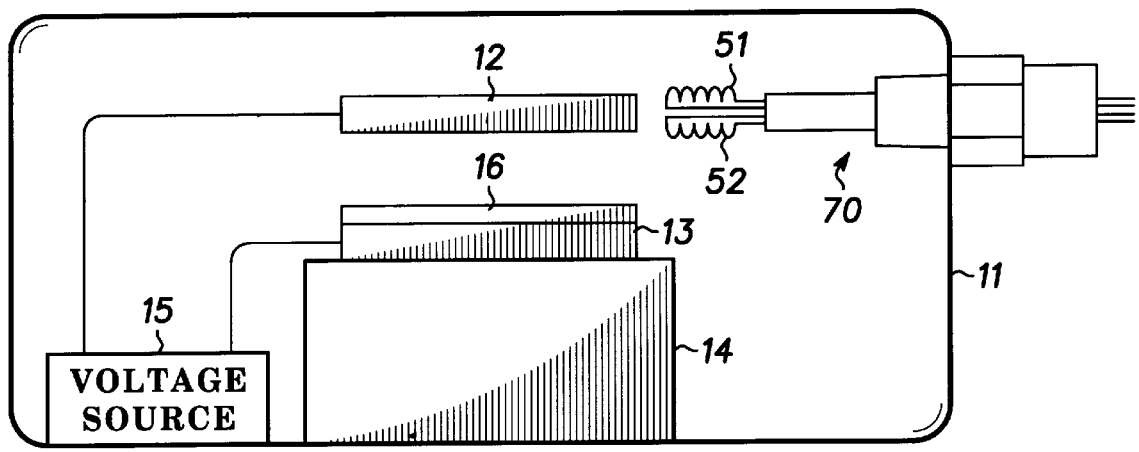
FIG. 1 illustrates, in general, the configuration of an apparatus in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is a representation of a reaction chamber 11 of an apparatus 10 such as a sputtering tool, an etching tool, or similar tool used for manufacturing electronic components and integrated circuits. In the example provided below, apparatus 10 is an MRC 603 sputtering tool. MRC is a registered trademark of Materials Research Corporation whose headquarters is in Orangeburg, N.Y. It should be understood that the present invention can be used in a variety of applications for depositing a portion of a target onto at least a portion of a semiconductor substrate or for etching at least a portion of a semiconductor substrate. More particularly, the present invention can be used in conjunction with plasma enhanced chemical vapor deposition (PECVD) equipment and ion etching equipment. For example, the present invention can also be used in an MRC 903.

In the example provided below, apparatus 10 is a radio frequency (RF) sputtering system. It should be understood that the present invention can also be used in a Direct Current (DC) sputtering system and one skilled in the art will understand the appropriate modifications that are required. A sputtering target 12 and a semiconductor substrate 13 are placed in reaction chamber 11 such as is shown in FIG. 1. Sputtering target 12 is utilized as a source of material for forming a film 16 on a surface of semiconductor substrate 13 in reaction chamber 11. Film 16 is one of many films used in the formation of integrated circuits on semiconductor substrate 13. For example, film 16 can be a conductive material such as an aluminum alloy to form interconnect structures, or film 16 can be a dielectric material such as silicon nitride, silicon dioxide, or the like that is used to form insulating structures in an integrated circuit.

Material is transferred from sputtering target 12 to film 16 by RF sputtering. An RF voltage source 15 is coupled to target 12 and to substrate 13 to facilitate the RF sputtering operation. To create a plasma to begin the sputtering or etching process, reaction chamber 11 is pumped to a vacuum and a plasma ignitor or simply an ignitor 70 is used to initiate a plasma. Ignitor 70 is an electronic device that has a plurality of filaments 51 or 52, one of which is heated with an electrical current to radiate thermal energy. The thermal energy generated by filament 51 or 52 excites atoms around ignitor 70, which in turn, forms ions which initiate the plasma in reaction chamber 11. RF sputtering operations are well known to those skilled in the art.

Referring simultaneously to both FIG. 2 and FIG. 3, a more detailed description of the preferred embodiment of plasma ignitor 70 is now provided. Ignitor 70 can include sleeves 30, 33, 35, and 38 that protect a plurality of wires 40–43, which pass from an external part of reaction chamber 11 to the internal part of reaction chamber 11. As explained in more detail below, wires 40–43 are used to activate and deactivate filaments 51 and 52. It should be understood that plasma ignitor 70 could comprise additional wires that are connected to additional filaments so that plasma ignitor has three or more filaments as desired. Sleeves 30, 33, 35, and 38 can be made from a variety of materials, but preferably are made from a ceramic material that is both thermally and electrically insulating. A VITON seal 34 is preferably used to isolate sleeve 35 from sleeve 33, which in turn, prevents gasses and pressure from entering or leaving reaction chamber 11 of apparatus 10. VITON is a registered trademark of E.I. du Pont de Nemours and Company incorporated in Willmington, Del.

A cap 32 and a body 31 are used to apply pressure to seal 34 and provide the necessary seal for reaction chamber 11. A ring 37 and a pin 36 are used to prevent wires 40–43 from twisting as cap 32 is tightened onto body 31. In particular, pin 36 is placed into a slot 39 on ring 37. Pin 36 also fits into a slot (not shown in FIG. 2) in body 31. Therefore, as cap 32 is turned, pin 36 prevents ring 37, and thus, sleeves 33 and 35 from rotating.

Figure 4:
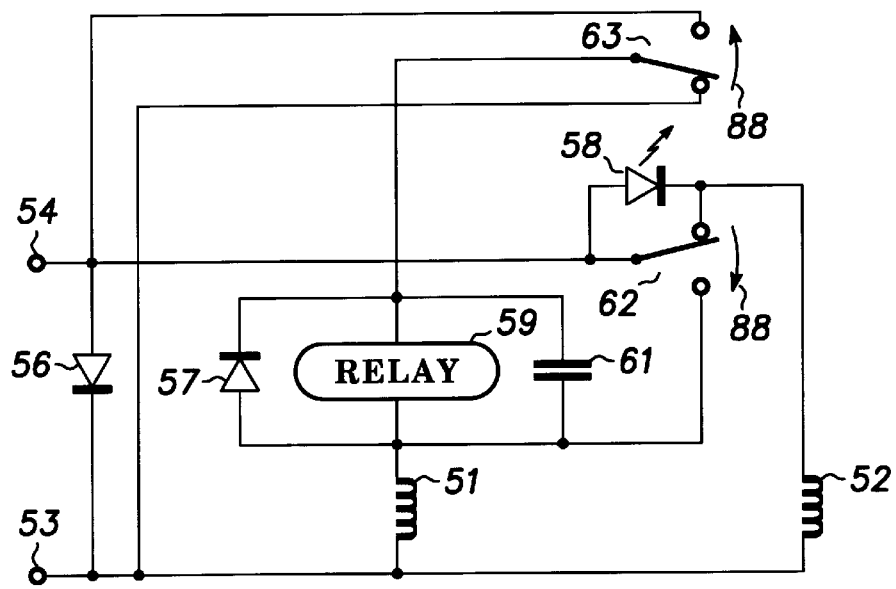
FIG. 4 is a circuit for operating the plasma ignitor in accordance with the present invention.

Turning now to FIG. 4, a circuit 50 that controls the operation of ignitor 70 is provided. More particularly, circuit 50 is used to control the activation and deactivation of filaments 51 and 52. Plasma ignitor 70 is used to create a plasma in reaction chamber 11 (see FIG. 1) by placing a voltage potential across terminals 53 and 54 of circuit 50. Preferably, a DC voltage of about 6.3 volts is placed across terminals 53 and 54. This in turn, activates light emitting diode (LED) 56 to indicate plasma ignitor 70 is in operation. The voltage potential also activates a relay 59 that causes contacts 62 and 63 to close in the direction indicated with arrows 88. A capacitor 61 is also simultaneously charged, which keeps relay 59 active and prevents contacts 62 and 63 from chattering when the voltage potential is removed from terminals 53 and 54. When relay 59 is in an active state, a voltage potential is placed across filament 51. This provides a current flow through filament 51. This in turn, causes filament 51 to thermally excite the gas molecules in reaction chamber 11, and consequently, a plasma in reaction chamber 11 is initiated. An LED 57 is used to indicate that filament 51 is active.

While filament 51 is active or activated, contact 62 is in a position that insures that filament 52 is deactivated. Plasma ignitor 70 is then subsequently used initiate a plasma in reaction chamber 11 so apparatus can be used to deposit or etch a plurality of semiconductor substrates until filament 51 has become worn with use and fails. When filament 51 fails after extended use, relay 59 is no longer grounded and goes into an inactive state. This causes contacts 63 and 62 to close in the direction opposite that which is shown in FIG. 4 with arrows 88. As a result, the voltage potential across terminals 53 and 54 is passed through an LED 58 and filament 52. Thereafter, filament 51 is inactive and filament 52 is used to create the plasma in reaction chamber 11 (see FIG. 1). LED 58 indicates that filament 52 is in operation. LED 57 is inactive when filament 51 fails. This provides an indication to the operator of apparatus 10 that the second filament of plasma ignitor 70 is in use and that replacement filaments should be held in reserve. In short, relay 59 in an active state enables filament 51 and disables filament 52, and relay 59 in an inactive state disables filament 51 and enables filament 52.

The makers and users of plasma sputtering and etching equipment that have single filament ignitors have long recognized that the throughput of such equipment is limited in part by the reliability and lifetime of the single filament used to help ignite the plasma in the reaction chamber. Up to now, the only solution has been to replace the filament at repeated intervals so that hopefully the filament can perform until the next scheduled preventative maintenance of the equipment. This is why the manufacturers of plasma sputtering and etching equipment suggest replacing the filaments anytime the reaction chamber is opened to replace the targets. For example, platinum targets are conventionally replaced every month, titanium-tungsten targets are conventionally replaced every two weeks, and aluminum targets are replaced nearly every week. Of course the frequency of target replacement depends in part of the number of wafers that are processed by the manufacturing equipment.

Inevitably, however, replacing the single filament at a fixed interval allows a filament to be used right up to the point of its failure. Consequently, the manufacturing process must be halted until the single filament in the reaction chamber is replaced. The failure of the filament can occur at any time and result in "down time," where the equipment is not in use, of anywhere from 12 to 24 hours. The unpredictability of the failure of the filament and the length of time it takes to replace the single filament can significantly impact the throughput of the plasma sputtering or etching tool. This in turn, leads to an increase in the manufacturing cost of integrated circuits that are fabricated with the processing equipment.

The present invention provides a solution to the inherent problem that single filament plasma ignitors have in the manufacture of integrated circuits. The present invention approximately doubles the lifetime that a plasma ignitor can be used in a manufacturing tool before the plasma ignitor has to be repaired because the plasma ignitor can still function if one of the filament becomes damaged. The circuit shown in FIG. 4 also provides advance warning of when the filaments of a plasma ignitor have to be replace by indicating with LED's 57 and 58 when a first filament has failed and the manufacturing equipment is relying on a second filament. This allows the operator of the tool to schedule the replacement of the filaments at a convenient time and order the necessary parts so that the failure of the filaments has less of an impact on the throughput of the manufacturing equipment. As a result, the throughput of the plasma sputtering or etching equipment is improved and ultimately the manufacturing cost of integrated circuits made using the equipment is reduced.

What is claimed is:

1. A method of manufacturing an electronic component comprising the steps of:

providing an apparatus having a target and also having a plasma ignitor, wherein the plasma ignitor includes at least a first filament and a second filament; placing a semiconductor substrate in a reaction chamber of the apparatus;

activating the first filament while the second filament is inactive wherein the activating results in formation of a plasma in the reaction chamber and depositing a portion of the target onto at least a portion of the semiconductor substrate in the reaction chamber; and activating the second filament while the first filament is inactive.

2. The method of claim 1 further comprising the step of etching at least a portion of the semiconductor substrate.

3. A method of manufacturing an integrated circuit comprising the steps of:

providing an apparatus having a reaction chamber wherein a target of a first material is within the reaction chamber;

placing a semiconductor substrate in the reaction chamber;

providing an electronic device having at least a first filament and a second filament;

placing the electronic device in the apparatus so that the at least first and second filaments are in the reaction chamber for creating a plasma of the material of the target; and placing a first current flow through the first filament while deactivating the second filament.

4. The method of claim 3 further comprising the step of creating a plasma in the reaction chamber while activating the first filament.

5. The method of claim 3 wherein the method further comprises the step of depositing a portion of the target onto at least a portion of the semiconductor substrate in the reaction chamber.

6. The method of claim 3 further comprising the step of etching at least a portion of the semiconductor substrate.

* * * * *